US012663374B2

(12) United States Patent
Tehrani et al.

(10) Patent No.: US 12,663,374 B2
(45) Date of Patent: Jun. 23, 2026

(54) SYSTEMS AND METHODS FOR PRECISION NONLINEAR MICROSCOPY

(71) Applicant: The Board of Trustees of the University of Illinois, Urbana, IL (US)

(72) Inventors: Kayvan Forouhesh Tehrani, Urbana, IL (US); Alejandro De La Cadena, Urbana, IL (US); Stephen A. Boppart, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 18/424,224

(22) Filed: Jan. 26, 2024

(65) Prior Publication Data

US 2024/0255424 A1      Aug. 1, 2024

Related U.S. Application Data

(60) Provisional application No. 63/441,714, filed on Jan. 27, 2023.

(51) Int. Cl.
| | |
|---|---|
| *G01N 21/63* | (2006.01) |
| *H03F 3/08* | (2006.01) |
| *H03L 7/08* | (2006.01) |

(52) U.S. Cl.
CPC ............. *G01N 21/636* (2013.01); *H03F 3/08* (2013.01); *H03L 7/08* (2013.01); *G01N 2201/12* (2013.01)

(58) Field of Classification Search
CPC .... G01N 21/636; G01N 2201/12; H03F 3/08; H03L 7/08; G02B 21/0024; G02B 2207/114
See application file for complete search history.

(56) References Cited

U.S. PATENT DOCUMENTS

| | | | | |
|---|---|---|---|---|
| 4,255,971 A | * | 3/1981 | Rosencwaig | ...... G01N 29/2425 |
| | | | | 356/432 |
| 5,441,054 A | * | 8/1995 | Tsuchiya | .............. A61B 5/0059 |
| | | | | 600/475 |
| 9,131,170 B2 | | 9/2015 | Mandelis et al. | |
| 2002/0033989 A1 | * | 3/2002 | Fisher | ................ A61K 49/0017 |
| | | | | 359/278 |

(Continued)

OTHER PUBLICATIONS

De la Cadena, Alejandro, et al. "Broadband stimulated Raman imaging based on multi-channel lock-in detection for spectral histopathology." Apl Photonics 7.7 (2022).

(Continued)

*Primary Examiner* — Georgia Y Epps
*Assistant Examiner* — Monica T Taba
(74) *Attorney, Agent, or Firm* — Quarles & Brady LLP

(57) ABSTRACT

Systems and methods of microscopy include and/or apply a laser light source configured to produce an excitation light; a modulator configured to modulate the excitation light to produce a modulated light; a pulse compressor configured to compress a pulse of the modulated light to produce a pre-compensated light; a beam scanner configured to raster scan the pre-compensated light on a sample; a detector configured to receive a light signal from the sample and produce a detection signal; and a lock-in amplifier configured to receive the detection signal and perform an electronic heterodyne amplification of the detection signal.

22 Claims, 11 Drawing Sheets

(56)     References Cited

U.S. PATENT DOCUMENTS

| 2016/0069673 A1* | 3/2016 | Takayanagi ........ | G01B 11/0641 |
| | | | 250/339.11 |
| 2016/0123806 A1* | 5/2016 | Varghese .............. | G01J 3/0264 |
| | | | 356/301 |
| 2016/0178439 A1* | 6/2016 | Freudiger ................. | G01J 3/44 |
| | | | 356/301 |

OTHER PUBLICATIONS

Freudiger, Christian W., et al. "Label-free biomedical imaging with high sensitivity by stimulated Raman scattering microscopy." Science 322.5909 (2008): 1857-1861.
Potma, Eric O., Conor L. Evans, and X. Sunney Xie. "Heterodyne coherent anti-Stokes Raman scattering (CARS) imaging." Optics letters 31.2 (2006): 241-243.
Yoo, K. M., Qirong Xing, and R. R. Alfano. "Imaging objects hidden in highly scattering media using femtosecond second-harmonic-generation cross-correlation time gating." Optics letters 16.13 (1991): 1019-1021.

* cited by examiner

SYSTEMS AND METHODS FOR PRECISION NONLINEAR MICROSCOPY

STATEMENT REGARDING FEDERALLY SPONSORED RESEARCH OR DEVELOPMENT

This invention was made with government support under FA9550-17-1-0387 awarded by United States Air Force and under 1R01CA241618, 1P41EB031772 awarded by the National Institutes of Health. The government has certain rights in the invention.

TECHNICAL FIELD

This disclosure relates to the field of microscopy. More particularly, this disclosure relates to systems and methods for electronic heterodyne amplification and filtering for precision nonlinear microscopy applications.

BACKGROUND

Label-free nonlinear microscopy techniques may be used for analyzing biological tissues, providing information. The simultaneous label-free autofluorescence multi-harmonic (SLAM) microscopy method utilizes multiple mechanisms of nonlinear optical contrast generation to identify molecular and structural signatures within tissues. These modalities detect intrinsic optical signals generated by ultrafast laser pulses upon interacting with the sample. A challenge in rapid label-free imaging of higher-order nonlinearities is the limited signal-to-noise ratio (SNR), stemming from the low number of detected photons. This low photon count often falls close to the noise level introduced by the laser, detectors, amplifiers, and electronics.

SUMMARY

Label-free nonlinear microscopy techniques exploit the inherent structural, cellular, and molecular characteristics of biological tissues, generating distinctive optical fingerprints specific to the specimen being examined. These methods, which include but are not limited to auto-fluorescence intensity and lifetime, coherent Raman, and harmonic generation microscopy, hold potential for point-of-procedure histopathology, cancer detection, and diagnosing other diseases, eliminating the conventional reliance on exogenous labeling. However, these signals, particularly those with higher order nonlinearity, often are weak, necessitating prolonged exposure times or the averaging of multiple frames to generate high SNR images. The present disclosure introduces an approach utilizing electronic heterodyne amplification (EHA) to achieve label-free imaging with both high speed and high SNR.

According to one example of the present disclosure, a microscopy system is provided. The microscopy system comprises a laser light source configured to produce an excitation light; a modulator configured to modulate the excitation light to produce a modulated light; a pulse compressor configured to compress a pulse of the modulated light to produce a pre-compensated light; a beam scanner configured to raster scan the pre-compensated light on a sample; a detector configured to receive a light signal from the sample and produce a detection signal; and a lock-in amplifier configured to receive the detection signal and perform an electronic heterodyne amplification of the detection signal.

According to another example of the present disclosure, a multi-channel lock-in amplifier is provided. The amplifier comprises a first-channel input configured to receive a first detection signal, the first detection signal corresponding to an imaging of a sample that has been irradiated with an excitation light from a laser light source; an input reference configured to receive a first reference signal having a known frequency; an internal oscillator; a phase lock loop (PLL) configured to lock the internal oscillator to the input reference, thereby to generate a second reference signal; a mixer configured to multiply the first detection signal by the second reference signal, thereby to generate a multiplied signal, containing, but not limited to, frequencies at the summation and the subtraction of the frequencies of detection and reference signals; a filter configured to filter the subtracted-frequency signal, thereby to generate a filtered signal; a rectifier configured to demodulate an envelope of the filtered signal, thereby to generate a rectified signal; and a gain amplifier configured to apply a gain to the rectified signal, thereby to generate an amplified signal.

According to another example of the present disclosure, a microscopy method is provided. The method comprises generating, by a laser light source, an excitation light; irradiating a sample with an imaging light, wherein the imaging light is based on the excitation light; detecting a light signal from the sample, thereby to generate a detection signal, wherein the light signal is responsive to irradiation of the sample with the imaging light; and performing an electronic heterodyne amplification of the detection signal, thereby to generate a digital image signal.

BRIEF DESCRIPTION OF THE DRAWINGS

Features, objects, and advantages of the present technology will become more readily apparent when consideration is given to the detailed description below. Such detailed description makes reference to the following drawings, wherein.

DETAILED DESCRIPTION

Figure 1:
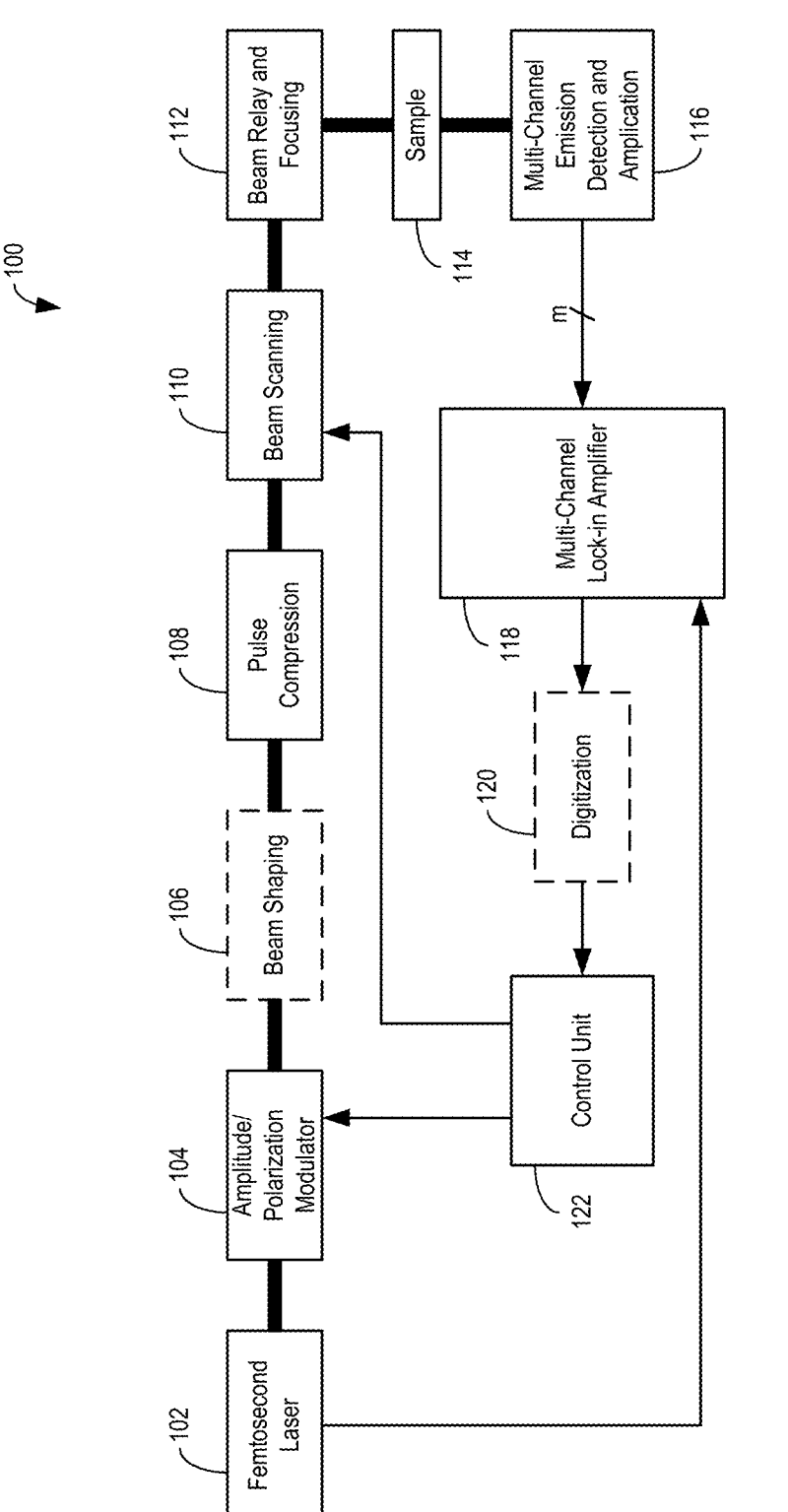
FIG. 1 illustrates a schematic diagram of an example system in accordance with various aspects of the present disclosure.

The present technology will now be described more fully with reference to the accompanying drawings, in which some, but not all, embodiments are shown. Indeed, the technology may be embodied in many different forms and should not be construed as limited to the embodiments set forth herein; rather, these embodiments are provided so that this disclosure will satisfy applicable legal requirements.

Likewise, many modifications and other embodiments of the technology described herein will come to mind to one of skill in the art to which the invention pertains having the benefit of the teachings presented in the following descriptions and the associated drawings. Therefore, it is to be understood that the disclosure is not to be limited to the specific embodiments disclosed and that modifications and other embodiments are intended to be included within the scope of the disclosure. Although specific terms are employed herein, they are used in a generic and descriptive sense only and not for purposes of limitation. Unless defined otherwise, all technical and scientific terms used herein have the same meaning as commonly understood by one of skill in the art to which the technology pertains.

Throughout the specification and claims, terms may have meanings suggested or implied in context beyond an explicitly stated meaning. Likewise, the phrases "in one embodiment," "in one example, "in one aspect," or "in one implementation" as used herein do not necessarily refer to the same embodiment, example, aspect, or implementation; and the phrases "in another embodiment," "in another example," "in another aspect," or "in another implementation" as used herein do not necessarily refer to a different embodiment, example, aspect, or implementation. It is intended, for example, that the claimed subject matter includes combinations of exemplary embodiments, examples, aspects, or implementations in whole or in part.

In general, terminology may be understood at least in part from usage in context. For example, terms such as "and," "or," or "and/or" as used herein may include a variety of meanings that may depend at least in part upon the context in which such terms are used. For example, the use of "or" to associate a list, such as "A, B, or C" is intended to mean "A, B, and C," here used in the inclusive sense, as well as "A, B, or C," here used in the exclusive sense. IN addition, the phrase "one or more" or "at least one" as used herein, depending at least in part upon context, may be used to describe any feature, structure, or characteristic in a singular sense or may be used to describe combinations of features, structures, or characteristics in a plural sense. Similarly, terms such as "a," "an," or "the," again, may be understood to convey a singular usage or to convey a plural usage, depending at least in part upon context. In addition, the term "based on" or "determined by" may be understood as not necessarily intended to convey an exclusive set of factors and may instead, allow for the existence of additional factors not necessarily expressly described, again, depending at least in part on context. Unless defined otherwise, all technical and scientific terms used herein have the same meaning as commonly understood by one of skill in the art to which the invention pertains.

The present disclosure provides for systems, devices, and methods which may be used in microscopy systems. For example, the present disclosure relates to improvements in methods for recovering nonlinear optical imaging signals (including, e.g., both label-free and labeled) from biological tissues, using EHA. The systems and methods described herein may increase the signal to noise ratio, resolve the images' nonlinear order, and resolve coherent and incoherent signals.

Nonlinear optical (multi-photon) microscopy is a technique that enables deep tissue optical sectioning of endogenous fluorophores and harmonophores, through an order n>1 process. This enables imaging of molecular, cellular, structural, and specific markers that highlight different parts of a biological tissue and their dynamic activity. Given all the aforementioned properties, nonlinear optical microscopy has become a tool used in many research institutes and industry as well. An example of this technique is the SLAM microscopy method, which is comprised of 2- and 3-photon autofluorescence (2PAF and 3PAF), and second and third harmonic generation (SHG and THG) microscopy modalities. The former two can identify and measure metabolic signatures such as FAD and NAD(P)H molecules, and the latter two can image structural conformation of a tissue such as collagenous structures and refractive index inhomogeneity.

These optical signals are generated in response to ultrafast laser pulses, with the signal strength directly proportional to the pulse peak power and inversely proportional to the pulse duration. To improve signal quality, laser pulses are commonly compressed to durations of tens of femtoseconds, increasing the pulse peak power, and thereby enhancing the signal fidelity. Despite the enhancement achieved through pulse compression, there are still various sources of noise that pose challenges for fast label-free imaging. In a multiphoton microscope, noise can originate from several sources, including 1) the laser, 2) the detector (such as photomultiplier tubes or PMTs), and 3) the electronics encompassing amplifiers and analog-to-digital converters. Laser noise can manifest as deviations in the amplitude of the laser output over time. The measurement of the relative intensity noise (RIN) of a laser typically exhibits a 1/f trend, primarily characterized by low-frequency components (<1 MHz). To mitigate the impact of the noisy region, one approach is to acquire signals at higher frequencies, where fluctuations are significantly reduced.

Lasers, detectors, and electronics generally produce different types of noise such as 1/f noise, dark noise, readout noise, and the like, that can overwhelm the genuine signals generated by the nonlinear process. PMTs, when used as detectors in multiphoton microscopy, can be affected by various sources of noise. These include shot noise, electron multiplication noise, thermal noise, dark current noise, electromagnetic interference, and after-pulsing. Some of these noise sources exhibit a white noise characteristic, while others have specific frequencies at which they occur. The electronics employed in the microscope system can also introduce noise, depending on their sources. The characteristics of electronic noise can vary, with some sources exhibiting white noise characteristics, while others may have specific frequencies associated with their occurrence.

In addition to noise, rapid label-free imaging of higher-order nonlinearities is affected by challenges such as spectral overlap and overlap of coherent and incoherent signals. Regarding spectral overlap, the generated signals are detected in comparative examples using high sensitivity detectors including but not limited to photomultiplier tubes, spectrally separated using optical filters with defined boundaries at certain wavelengths. However, the emission spectra of fluorescent molecules (especially endogenous ones) are typically wider than the filter bandwidth in the comparative examples, and often extend to other channels, causing cross talk between channels. Regarding the overlap of signals, another characteristic of nonlinear optical microscopy is that generated signals are both coherent (e.g. harmonic generation microscopy) and incoherent (e.g. fluorescent microscopy). Because the fluorescent molecules' spectra are wider than the harmonic generation spectra, their overlap could make the measurement indeterministic in comparative examples.

The present disclosure provides systems and methods to overcome these challenges and surpass the 1/f noise, for example by implementing electronic heterodyne amplification specifically for the low-yield three-photon signals, namely 3-photon autofluorescence and third harmonic generation. In one example, the multi-channel heterodyne amplification method described herein enhances the SNR by a factor of 2.3, resulting in a five-fold reduction in the number of images required to achieve the same SNR image. To illustrate these systems and methods and the benefits derived therefrom, each amplified channel was fully characterized, and the method was successfully applied for high-speed in vivo imaging of mouse cranial bone, bone marrow cavity, spermatozoa, and other cellular dynamics at a frame rate of 3.4 Hz. Additionally, this technique was shown to provide faster mosaicking of larger fields-of-view in ex vivo tissue. By combining SLAM microscopy with electronic heterodyne amplification, the present disclosure enables rapid label-free imaging with enhanced SNR and improved image quality. This approach offers applicability in biological and biomedical research, facilitating new insights into the dynamics and structures of complex biological systems.

EHA (also known as lock-in amplification) is a method initially used in radio communication to recover very weak signals, and has been translated and used in imaging application such as Raman scattering. One method in radio communication is amplitude modulation of the signal over a carrier frequency with much higher frequency. Multiphoton microscopy takes advantage of a laser pulse train which acts as the carrier frequency, with the optical signal of interest being amplitude modulate as a wave packet. The generated signals are functions of the input power; i.e., output power $\propto$ (input power)$^{order\ n}$. In multiphoton microscopy, heterodyne amplification can be used by locking-in the collected signals to a known frequency (either a function based signal or the laser clock) and filtering out the signals outside of the frequency of interest. By mixing (multiplying) the input $f_{in}$ and the oscillator $f_{osc}$ signals, two new frequencies are generated, $f_{in}+f_{osc}$ and $f_{in}-f_{osc}$. Because the two frequencies are matched, the carrier frequency is removed, and with the help of a low-pass filter, the wave-packet is recovered. This process is called "heterodyning" and allows the recovery of weak signals in multiphoton microscopy by eliminating noise contributions, enabling shot-noise-limited imaging.

This enables, for example, (1) surpassing the noise contributions from frequencies other than the carrier frequency, and recovering very weak signals; (2) by locking-in to the electrical harmonics of the collected signals of a function-based modulation, resolving the order of the process; and (3) because coherent signals are dependent on light polarization and incoherent signals are not, by function-based polarization modulation of the incident light, coherent and incoherent can be separated from each other.

Certain examples of the present disclosure provide for multi-channel noise cancelation by lock-in to the laser clock frequency and/or function-based amplitude modulation and lock-in detection. In the former, taking advantage of the carrier frequency provided by the laser clock, locking the signal collection to the laser frequency or its electrical harmonics suppresses noise generated from other sources that are not within the bandwidth of the lock-in process. This may be especially effective for n>2 order processes such as 3-photon imaging and third harmonic generation because their signal generation efficiency is very low. In the latter, the laser pulse train is amplitude-modulated with a known function (including but not limited to sine or cosine). The detection may be locked in to one or more expected frequencies based on the modulation function (including but not limited to the function frequency or any of its harmonics).

Certain examples of the present disclosure provide for order-resolved separation of channels. Because the generated signals are a power function of the laser amplitude, function-based amplitude modulation results in generating the known modulation function at the power of the process order. For instance, a $2^{nd}$ order process will produce a quadratic function and a $3^{rd}$ order process will produce a cubic function. Each of these orders will produce multiple electrical harmonics with known coefficients. For a complicated sample with multiple orders (different molecules being excited at $2^{nd}$ or $3^{rd}$ order), such as a biological tissue, a summation of all of these harmonics are generated. Since the coefficients at each of these electrical harmonics are known, by solving for the order, different molecule signatures can be resolved.

Certain examples of the present disclosure provide for polarization-resolved separation of coherent and incoherent light generation. Coherent nonlinear signals such as harmonic generation microscopy are polarization dependent, unlike incoherent signal generation of fluorescent molecules. Therefore, function-based polarization modulation of the incident light will result in multiplication of the generated light by the function to the order of the process. Since incoherent light generation is not polarization-dependent, the generated light from the fluorescent molecules will not be affected by the polarization modulation. Therefore, by measuring the electrical harmonics at the expected frequencies, the coherent and incoherent generated light can be separated from each other.

The present disclosure may be implemented in different manners, including (1) through the use of an analog lock-in amplifier, (2) through the use of a digital lock-in amplifier instrument for digitization and direct transfer to a PC for image reconstruction, and (3) epi or transmission mode signal detection.

FIG. 1 shows a schematic diagram of an example of the present disclosure. Parts of the system 100 include: a laser light source such as a femtosecond laser 102, which produces excitation light for multi-photon microscopy and a laser clock (e.g., to be provided to a lock-in amplifier); a modulator such as an amplitude/polarization modulator 104, by which the excitation light goes through either amplitude modulation or polarization modulation; a beam shaper 106, which may be omitted in some implementations, and which when present ensures that the beam's spatial profile is sufficient for high imaging quality (e.g., Gaussian or top-hat forms); a pulse compressor 108, which may pre-compensate for dispersion and ensure the shortest pulses arrive at the sample 114; a beam scanner 110, which may raster scan the beam on the sample for image formation; a beam relay and focusing element 112, which includes optical elements such as scan lens, tube lens, objective lens to produce a tight focus on the sample plane; the sample 114, which may be a biological tissue or cell that is placed in a 3-dimensional stage; a multi-channel emission detection and amplification element 116, which may comprise detectors such as photomultiplier tubes and/or amplifiers (current-to-voltage, or voltage-to-voltage); a multi-channel lock-in amplifier 118, which receives the analog signals for m channels, m being an integer, and performs electronic heterodyne amplification either in analog format or digital format; a digitizer 120, which may be omitted in some implementations (e.g., if the output of the lock-in amplifier 118 is digital); a control unit 122, such as a computer equipped with proper data-acquisition cards, which produces the necessary signals for amplitude/polarization modulation and beam scanning, and also receiving signals and reconstruction of final images. In one non-limiting example, the number of channels m is four; however, in other examples m may be another integer, including one.

Figure 2:
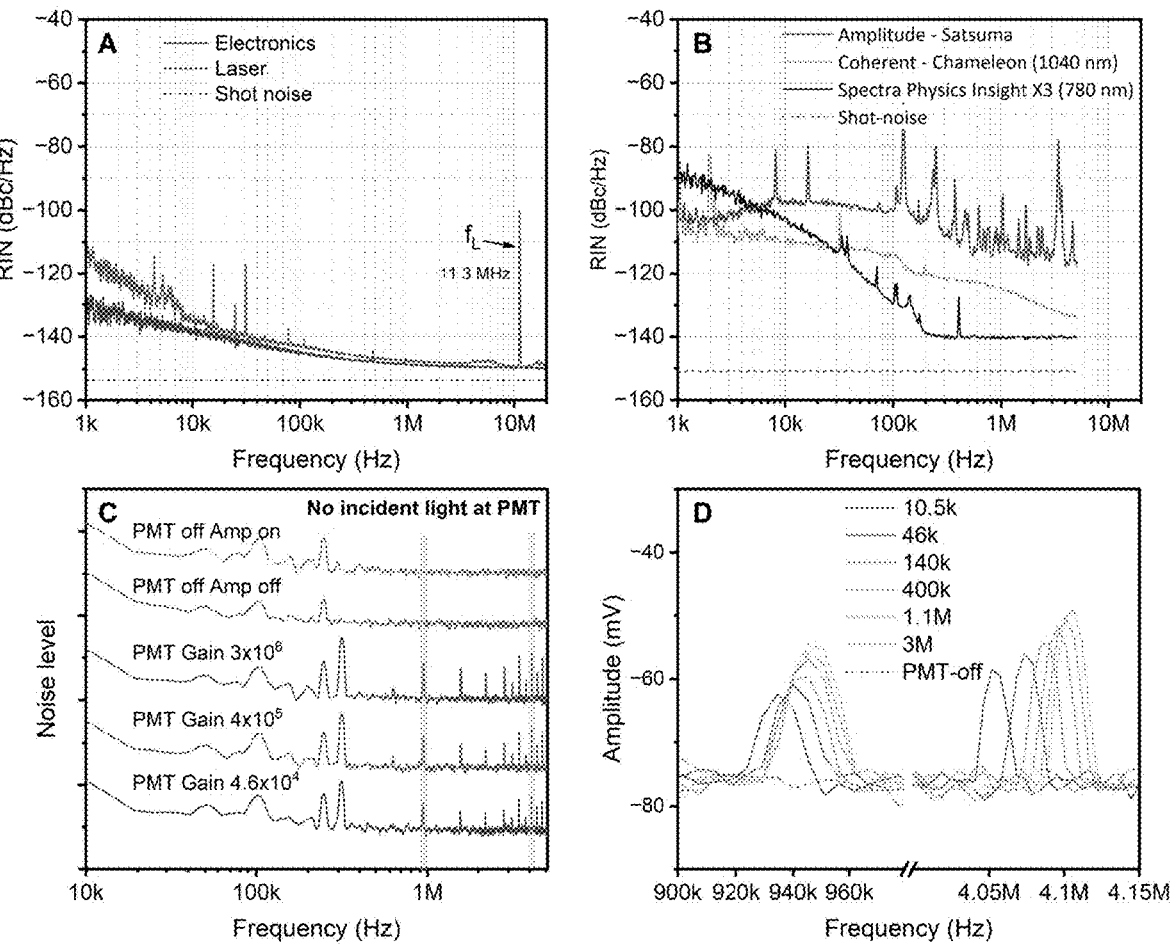
FIG. 2 illustrates graphs of example measurements in a system in accordance with various aspects of the present disclosure.

FIG. 2 illustrates graphs of example measurements in a system in accordance with various aspects of the present disclosure. From graph A, it can be observed that significant noise contributions originate from the laser pulse train and the electronics used for measurement, particularly in the low-frequency region (below 1 MHz) where comparative example measurements are performed. However, in the high-frequency region, the relative intensity noise (RIN) approaches the noise floor, making measurements in this region benefit from lower noise levels, both optically and electronically.

The characteristics of the laser used in nonlinear signal generation have an impact on the quality of the resulting images. When the laser source exhibits noise, it introduces noise artifacts into the acquired images, making the recovery of signals from noise a non-trivial task. In such cases, longer pixel dwell time, or averaging of multiple frames, becomes necessary to improve the SNR, which, in turn, leads to lower frame rate image acquisition. Therefore, one may measure the inherent noise of the laser to gain insights into the spectral filtering required for achieving low-noise measurements. Graph A of FIG. 2 shows the RIN of our ultrafast femtosecond laser (Flint, LightConversion). RIN is a metric that quantifies the level of noise exhibited by a laser source at a given frequency. It is defined as the ratio of noise power $\delta(f)$ to the mean power $\bar{P}$. To measure RIN, the beam was directed to a dual-output photodiode (PDB450C, Thorlabs). The output voltages-one operating at radio frequencies and the other being monitor or DC output—were converted to optical powers using the responsivity and gain of the photodiode. The radio frequency output was connected to a lock-in amplifier (UHFLI 600 MHz Lock-in Amplifier, Zurich Instruments), which allowed acquisition of the $\delta(f)$ spectrum of the laser by sweeping the spectrum and automatically adjusting the bandwidth within 0.5-20 MHz. The monitor output of the photodiode was connected to an oscilloscope, enabling the measurement of $\bar{P}$. The measurements revealed that overall, this ultrafast laser exhibited a lower noise floor compared to other commercial lasers used for multiphoton imaging (see Graph B), but the higher noise level at lower frequencies affect image quality. Additionally, the noise level at the laser frequency is 3.5 orders-of-magnitude lower than that at 1 kHz, implying that if one were to bandpass filter the spectrum by locking-in the measurement at the laser frequency, one could obtain images virtually free of laser noise (although electronic noise may still be present at negligible levels).

Another source of noise in PMTs is the amplification of spontaneously generated electrons due to thermionic and field emissions (Graphs C-D). Thermionic emissions, also known as dark noise, are typically minimized by cooling the PMT, and they are less dependent on the gain, although high gain settings can still amplify even the smallest emissions. On the other hand, field emission is caused by the local electric field generated by the high voltage necessary for high gain amplification. When new electrons are generated, they can collide with other surfaces, resulting in a significant flux of electrons. Increasing the bias voltage leads to a faster increase in field emission compared to gain, resulting in a significant increase in noise with higher gains. PMTs may be operated in a region known as "sub-threshold emission" where the bias voltage is set to a level that prevents field emission from dominating the noise floor.

Figure 3:
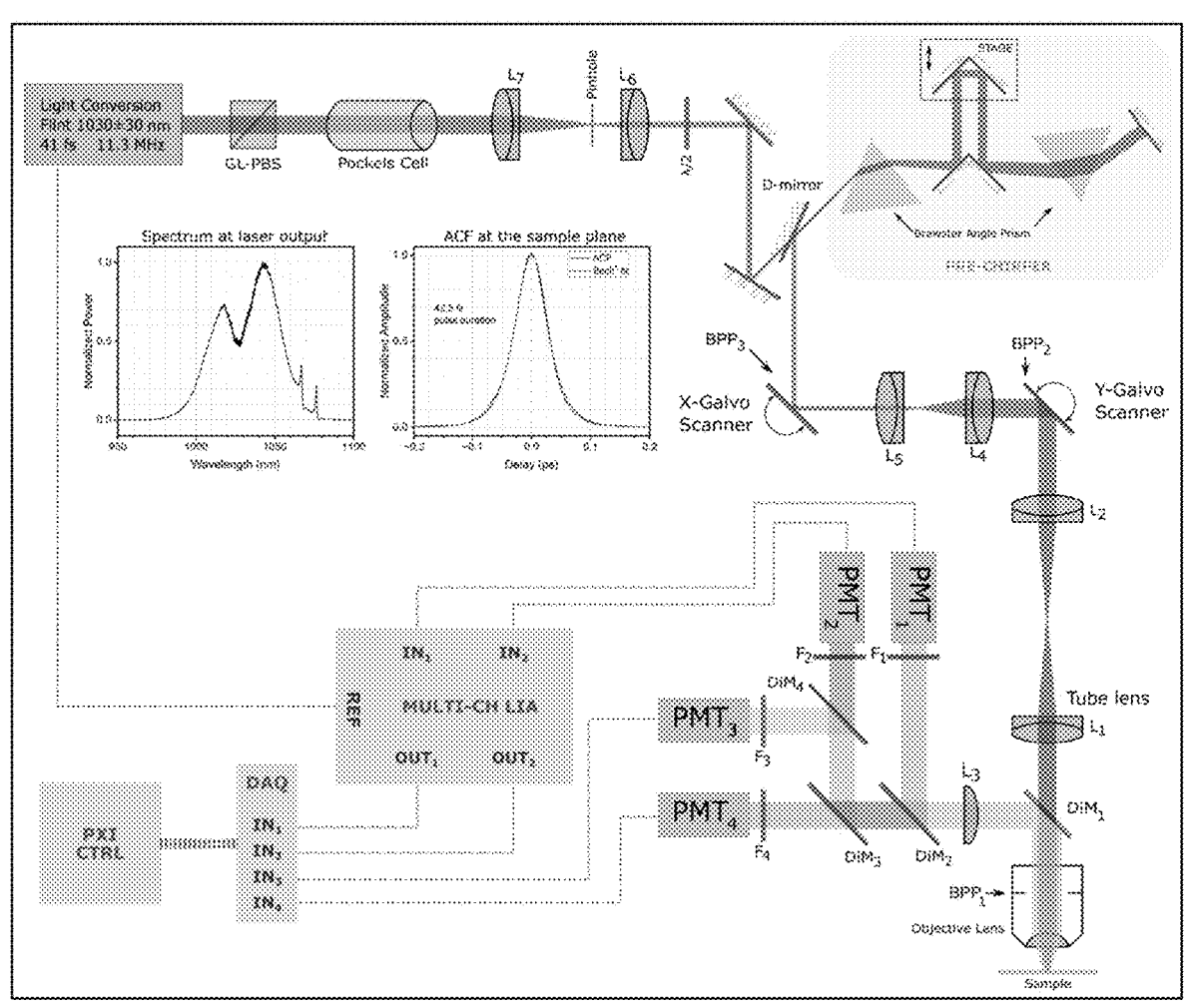
FIG. 3 illustrates an optical design of an example system in accordance with various aspects of the present disclosure.

FIG. 3 shows an illustration of a particular implementation for realizing the schematic diagram presented in FIG. 1. In FIG. 3, the optical design and the signal collection and heterodyne amplification are depicted. Objects labeled PBS are polarizing beam splitters, L are lenses, objects labeled DiM are dichroic mirrors, objects labeled F are filters, objects labeled BPP are back pupil planes, objects labeled PMT are photomultiplier tubes, and objects labeled LIA are lock-in amplifiers. In FIG. 3, the light conversion element (upper left) may correspond to femtosecond laser 102, polarizing beam splitter GL-PBS and the Pockels cell may correspond to the amplitude/polarization modulator 104, the pre-chirper may correspond to the pulse compressor 108, the x- and y-galvo scanners may correspond to the beam scanner 110, the dichroic mirrors and photomultiplier tubes may correspond to the detection and amplification element 116, the multi-ch LIA may correspond to the lock-in amplifier 118, the DAQ may correspond to the digitizer 120, and the PXI CTRL circuit may correspond to the control unit 122.

In one example, the system of FIG. 3 utilizes a femtosecond laser, as described above, as the excitation source. To provide performance adjustability, the laser beam passed through a Glan-laser polarizer (GL10-B, Thorlabs) to enhance the polarization extinction ratio and increase the efficiency of the Pockels cell (360-80-02 LTA Conoptics with 302A driver). In our experiments, the Pockels cell was utilized to maintain power at constant levels. To improve the spatial distribution of the beam after the Pockels cell, the beam was directed through a pinhole within a telescope ($L_6$ & $L_7$) to generate a fully Gaussian beam profile.

Pulse duration and peak power are additional factors influencing the efficiency of the nonlinear process. The magnitude of the produced signal is directly proportional to the pulse peak power and inversely proportional to the pulse duration. The pulse duration is determined by the spectral support of the laser, where a wider optical bandwidth results in narrower pulses according to the Fourier transform relationship. Therefore, dispersion compensation was a part of this system to ensure the pulses were as short as possible at the sample plane. Negative dispersion was introduced using a pre-chirper consisting of a pair of Brewster angle prisms (10SF10 Newport). To adjust dispersion, an autocorrelator with a sensor at the sample plane (A.P.E. Carpe) was employed to monitor the pulse duration. Measurements of the laser source indicated a 60 nm bandwidth, resulting in 42.5 fs pulses at the sample plane, after compensating for system dispersion (see insets).

For beam raster scanning, a pair of galvanometer mirrors (6215H, Cambridge Technologies), conjugated together using a 4f telescope ($L_4$ & $L_5$), a scan lens ($L_2$) and a tube lens, was utilized. The emitted light from the sample was redirected to the PMTs at an image plane ($L_3$) using dichroic mirrors ($DiM_1$: 705 nm, $DiM_2$: 409 nm, $DiM_3$: 560 nm, $DiM_4$: 495 nm) and filters ($F_1$: 390 sp, $F_2$: 447/60 nm, $F_3$: 509/22 nm, $F_4$: 632/60 nm). Cooled PMTs (H7422-40, Hamamatsu corp.) were used for the weakest channels ($PMT_1$: THG and $PMT_2$: 3PAF) to reduce dark current, while uncooled PMTs (PMT2101, Thorlabs) were employed for the strongest signals ($PMT_3$: SHG, and $PMT_4$ 2PAF) as they readily surpass the noise level without cooling.

The signals from $PMT_{1\&2}$ were sent to transimpedance amplifiers (TIA60, Thorlabs) to convert current to voltage, and then sent to a four-channel LIA (Moku: Pro, Liquid Instruments) for digitization and heterodyne amplification. The LIA was configured to lock its internal oscillator (sine wave) to the laser clock using a phase lock loop (PLL). The signals from the PMTs were demodulated using the locked oscillator with adjustable phase. Adjustable parameters are time constant (TC), gain, and output offset (see FIG. 4). The TC was selected to integrate over multiple pulses and increase the SNR. The real parts of the outputs were digitized and recorded for image generation. Signals from $PMT_{3\&4}$ were directly sent to the digitizers.

For beam steering, signal collection, and image reconstruction, an embedded controller (PXIe-8135, National Instruments) and a DAQ card (PXIe-6356, National Instruments) installed in a chassis (PXI1071, National Instruments) were employed. The control of the system was carried out using Scanimage, a Matlab-based software.

Figure 4:
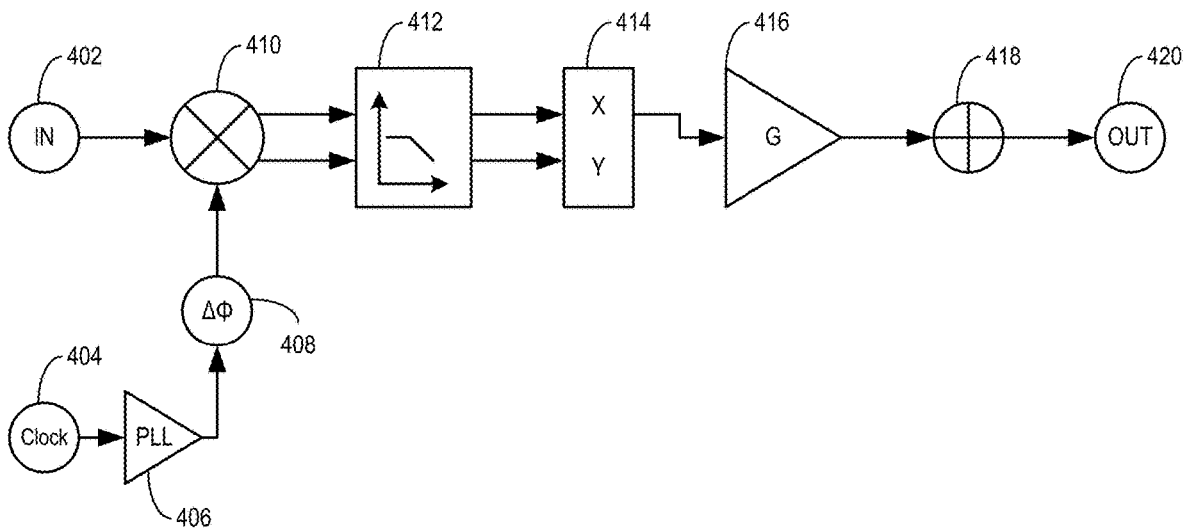
FIG. 4 illustrates a schematic diagram of an example amplifier in accordance with various aspects of the present disclosure.

FIG. 4 illustrates an example of the LIA illustrated in FIG. 3. At input 402, the outputs from $PMT_{1\&2}$ are provided. At input 404, the laser clock is provided. The PLL 406 locks its internal oscillator (sine wave) to laser clock, allowing precise synchronization. If needed, the oscillator signal is provided with a given phase change 408. The signal from input 402 is multiplied by the oscillator signal at a mixer 410, then filtered by filter 412 and rectified by rectifier 414 to demodulate the envelope (the actual signal from the imaging voxel, less the noise). The gain stage may be provided by amplifier 416 to amplify the signal with a gain G (in dB), and a $V_{offset}$ can be added at adder 418 to the recovered signal before it is sent to the output 420.

NADH solutions were measured at different concentrations and the gain levels of EHA were varied to assess the effectiveness of the EHA method. Images were acquired at a depth of 60 μm—halfway inside the well, covering an area of 20×20 μm², and average to obtain a single intensity measurement value. The standard deviation of this region was also calculated, to determine SNR by dividing the mean by the standard deviation.

Figure 5:
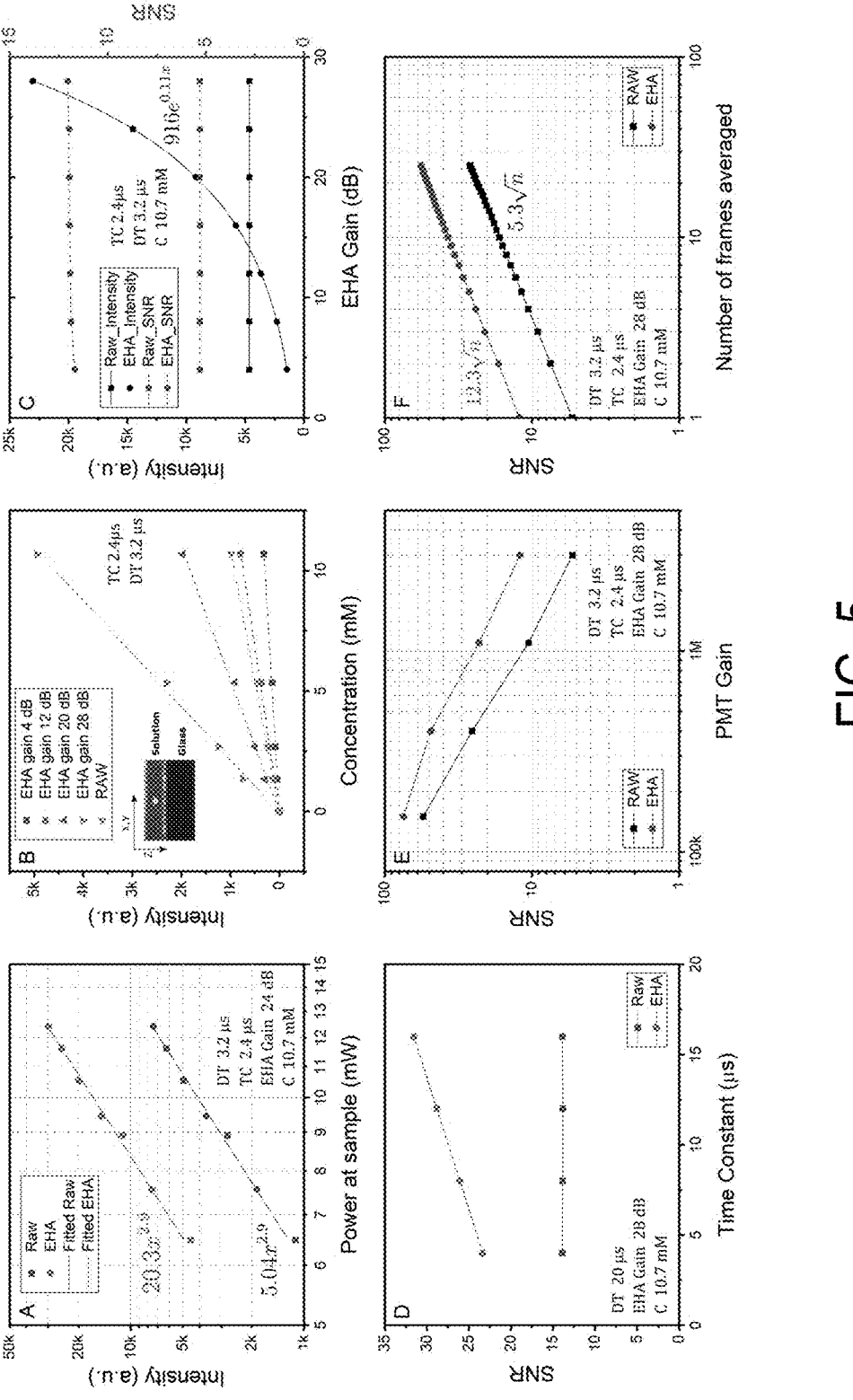
FIG. 5 illustrates graphs of example enhancement of autofluorescence measurements in accordance with various aspects of the present disclosure.

FIG. 5 shows several graphs to illustrate the enhancement of 3-photon autofluorescence measurement in accordance with an example of the present disclosure. Graph A is a power curve and fit showing third order excitation of the molecule. Graph B shows the effect of EHA gain on measurement sensitivity. NADH concentration is plotted vs. intensity with different gain levels, and constant dwell time and time constant TC. The inset shows an axial cross-section of the sample with the glass and the NADH solution, in which the yellow star shows where images for the measurements in these experiments are performed. Graph B shows that increasing the gain enhances the sensitivity of the measurement, enabling the detection of even very low concentrations with high contrast, compared to raw measurements from the PMT. In the raw measurements an average of 21-94 photons were received by the detector, for concentrations of 1.33 to 10.7 mM, respectively.

While increasing gain steepens the concentration-intensity slope, the SNR of the measurement remains the same when the TC is unchanged. In fact, it is the TC that has the largest effect on noise reduction. TC determines the extent of input-oscillator product, with longer integration resulting in rejection of frequencies outside of the oscillator frequency band. This is shown in Graph C, which illustrates gain vs. intensity compared with SNR. Although higher gain translates to higher intensity, the SNR is not affected. Graph D illustrates the effect of TC on SNR, and in particular shows a linear relation between TC and the SNR when the pixel time is kept constant. The dwell time, gain and concentration were kept constant. By varying the TC from 20% (4 μs) to 80% (16 μs) of the dwell time (20 μs), enhancement in SNR can be observed, with the SNR enhancement ($SNR_{EHA}$/$SNR_{raw}$) increasing from 164% to 228%. The integration occurs within 80% of a single pixel, avoiding bleed through to the next pixel.

Graph E illustrates the PMT gain vs. SNR. Higher PMT gain means more noise amplification, hence less SNR; EHA improves the SNR by a factor of 2.3. The label-free signals produced in the sample are usually at very low levels, often tens of photons per pulse, hence high amplifications may be used to detect these small photon emissions and convert them to acceptable levels for image reconstruction. Graph E shows the SNR of images generated with a cooled PMT using a uniform NADH solution. The data confirmed that higher gain settings result in a significant drop in SNR. However, with the EHA method the genuine signals were recoverable, and it was possible to suppress the noise caused by field and thermionic emissions. A 2.26-times improvement in SNR was observed for the highest gain setting, consistent with the NADH measurement improvement. This means that one can operate the PMT at a gain of $3\times10^6$, while benefitting from the SNR equivalent to a gain of $9\times10^5$, 3.3 times lower and closer to the subthreshold region.

In imaging applications, SNR is sometimes improved by averaging multiple frames. Photon detection (including dark, shot, and other sources of noise) follows a Poisson distribution where standard deviation equals the square root of the mean of a series. For a uniform image, the SNR=mean (image)/std(image), and with a Poisson distribution it then becomes SNR=$\sqrt{mean(image)}$. Therefore, if n images are averaged the SNR becomes proportional to $\sqrt{n}$. Graph F illustrates the number of frames averaged vs. SNR for EHA and raw. A single frame of EHA equals 5 raw frames averaged. A time series of 25 images was imaged, and the SNR was calculated when a sequence of n frames were averaged. EHA improved the SNR by a factor of 2.3, resulting in a 5-fold reduction in the number of images required to be averaged to reproduce the same SNR.

Figure 6:
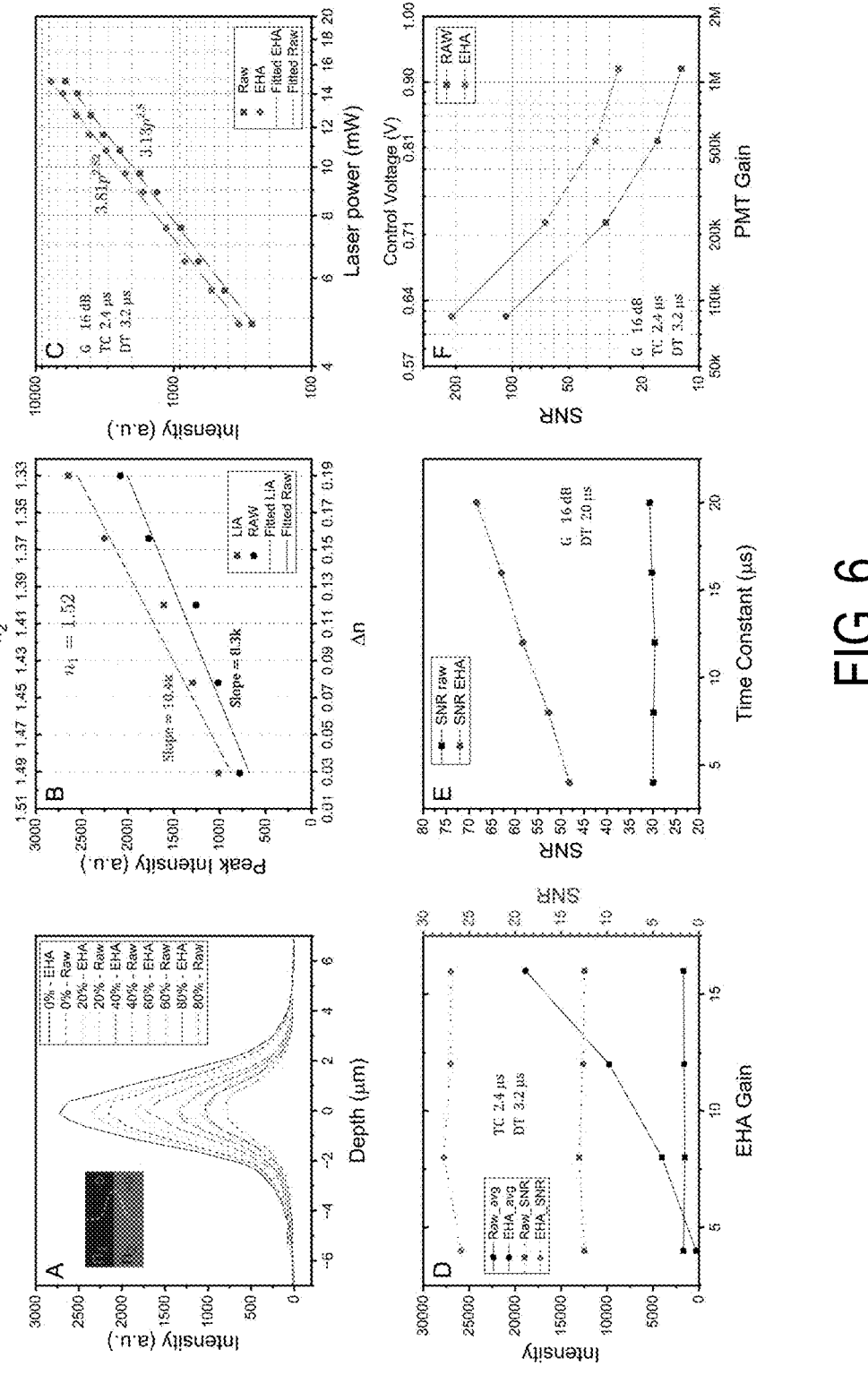
FIG. 6 illustrates graphs of example enhancement of third harmonic generation (THG) measurements in accordance with various aspects of the present disclosure.

To further assess, EHA was characterized by applying the method to the THG channel. FIG. 6 shows several graphs to illustrate the enhancement of THG measurement. Graph A is a THG cross-section of the glass ($n_1$)–sucrose solution ($n_2$) with different concentrations, with 1 μm axial spacing. A gaussian fit is applied to each cross-section (not shown) to measure the peak THG for each concentration. Graph B shows peak THG vs. the refractive index difference (Δn) and shows their linear relation. Graph C shows the power curve of the THG signals as measured, and shows third order dependence. Graph D shows THG signal intensity and SNR vs. the EHA gain. Although larger gain results in increased signal output but the SNR remains the same. Graph E shows SNR vs. TC. SNR increases with increased integration time. Graph F shows SNR vs. PMT gain. EHA improves the SNR with high PMT gain.

In these measurements the images were acquired at the boundary of a sucrose solution and glass. Sucrose shows a semi-linear relationship between its concentration (in water) and its index of refraction, with 0% (w/v) having an index of 1.33 and 84% (w/v) showing an index of 1.5. The sucrose solutions were therefore made with concentrations ranging from 0% to 80%, and measured an axial cross section of the THG signal at the boundary (Graph A). A 0% solution (water) shows the highest contrast due to the index mismatch being the highest, and 80% having the lowest signal due to lowest index mismatch. Gaussian fits were applied to these cross-sections and the maxima of the fit were recorded (Graph B). A linear relation and an improved sensitivity were shown with the EHA method compared to raw PMT collection. The sensitivity curve slope improved by 25%. Because the THG signal within a biological sample, where the refractive index mismatch is often minimal, is usually very weak, improvement in its sensitivity results in better detection of cellular boundaries and other intra- or extra-cellular inhomogeneities. It was also confirmed that the collected signals have a cubic power dependence, by measuring their emission intensity when input power varies, as shown in Graph C.

Similar to the measurements shown for the NADH solutions, the intensity and SNR were measured with different gains. As Graph D shows, although the EHA gain increases the measured intensity, the SNR remains consistently at ~22, an enhancement factor of 2.2. The TC was also varied from 20% to 100% of the dwell time (20 μs) the SNR was observed to improve from 48 to 69, compared to 30 for the raw PMT measurements (Graph E). Moreover, the noise characterization of the PMT was measured for THG measurements (Graph F). In this case the curves appear to be flattening in the increased gain, which may be due to saturation of a few pixels within the images.

Solutions of NADH (10128023001, Roche Diagnostics) were prepared by serial dilution of a stock solution (82.8 mM), to the lowest concentration of 1.3 mM. These solutions were sandwiched between a glass slide and a coverslip, separated by a 120 μm spacer (EMS 50-344-24). To create sucrose solutions, an 80% concentrated solution of sucrose was prepared (Sigma S0389) in ultrapure water (18.2 MΩ-cm). This solution was then serially diluted to various concentrations, ranging from 80% down to 0% sucrose. The sucrose solutions were also sandwiched between a glass slide and a coverslip, separated by a spacer. For in vivo mouse cranial bone imaging, a headbar was implanted on the skull of a C57/B6 mouse. On the opposite side of the skull, a glass window was installed with phosphate-buffered saline (PBS) between the glass and the bone. The edges of the glass and any exposed areas were sealed using dental cement. This procedure and imaging were performed while the mouse was under anesthesia using a mixture of Ketamine (150 mg/kg), Xylazine (7.5 mg/kg), and Acepromazine (3 mg/kg).

Mouse sperm samples were collected from an 8-week-old male C57/B6 mouse. The mouse was euthanized by cervical dislocation. The cauda epididymides were carefully dissected and transferred to a plastic Petri dish. A small ventral incision was made to facilitate the observation of freely swimming spermatozoa within the epididymides. To maintain the viability of the sperm during imaging, the Petri dish was placed on a warming plate set at a temperature of 34° C. For mouse ovary imaging, a female C57/B6 mouse was euthanized by cervical dislocation. An incision was made in the abdominal cavity to access the ovary. The ovaries were displaced to prepare them for imaging.

All animal procedures were conducted in accordance with protocols approved by the Institutional Animal Care and Use Committee (IACUC) of the University of Illinois.

Figure 7:
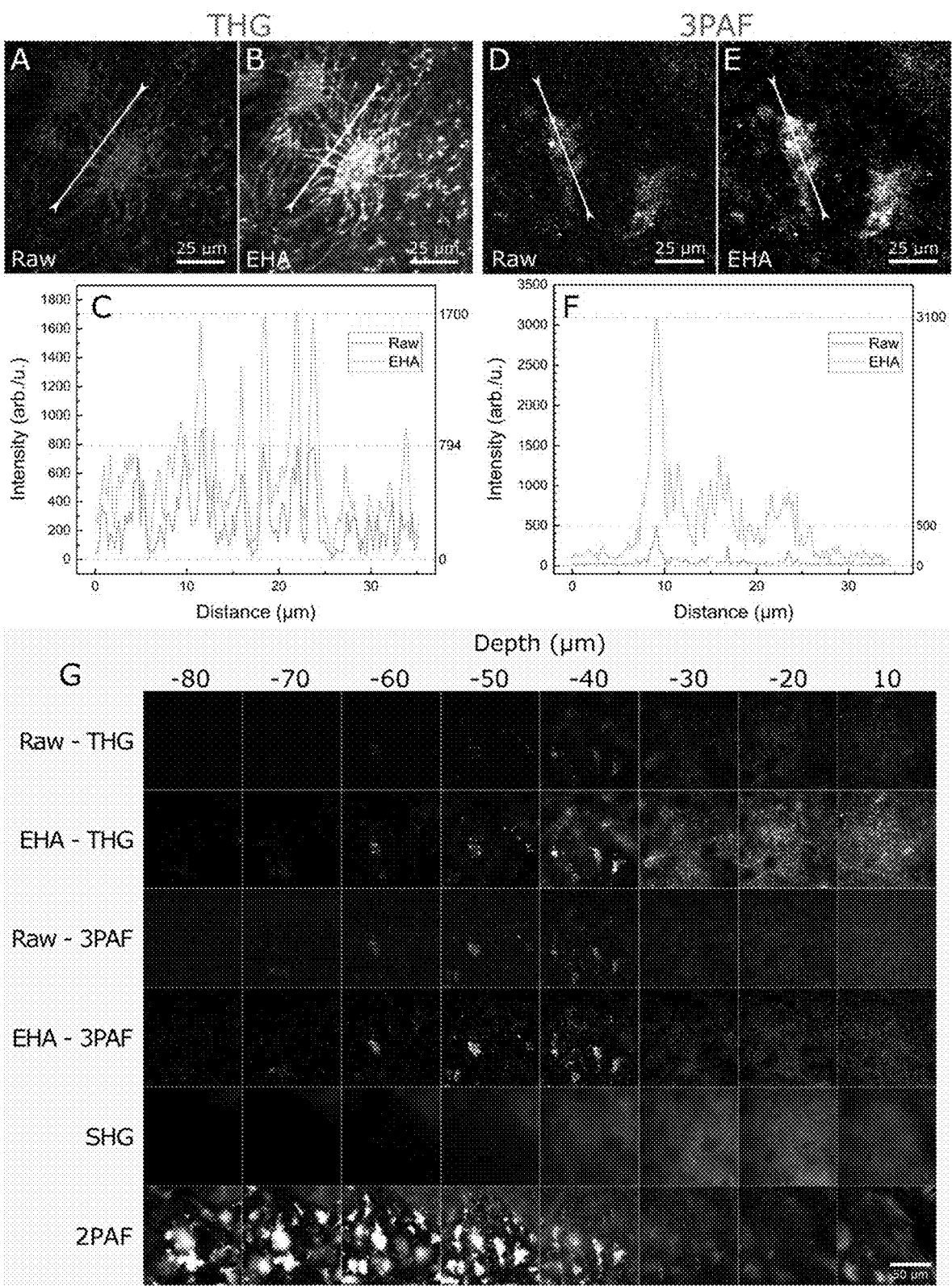
FIG. 7 illustrates example imaging results in accordance with various aspects of the present disclosure.

Using the above, in vivo imaging of mouse cranial bone was performed, focusing on the lacunae canaliculi network (LCN). The LCN is a complex system within the bone matrix consisting of interconnected lacunae (small spaces) and canaliculi (tiny channels). It plays a role in facilitating cell signaling between osteocytes and other bone cells, as well as the exchange of nutrients and waste products. Due to the large index mismatch between the LCN contents and the surrounding bone matrix (~1.33, and ~1.6, respectively), a strong third harmonic generation (THG) signal is generated at these boundaries. However, the highly scattering nature of bone tissue and the low cross-section of the third-order THG process often result in weak signals in comparative examples, that can benefit from the EHA system according to the present disclosure to enhance their strength. FIG. 7 illustrates the results of the imaging procedures.

EHA showed significant improvement in the THG signal acquired from the LCN within the bone matrix, as demonstrated in FIG. 7 Graphs A-C. After background removal (removing offset by subtracting the minimum value of the frame), the THG signal peak was observed to improve by a factor of 2.14 in the EHA image compared to the raw image. Visually examining both images, it is evident that the EHA image provides higher contrast and reveals more discernible structures. The extended dynamic range offered by EHA enables the visualization of finer details and variations in refractive index.

As imaging is performed deeper into the tissue, the bone marrow cavity where cells produce optical metabolic signatures, including those from NADH and FAD molecules, is encountered. Acquiring the NADH signal through the 3-photon process is less efficient compared to lower-order processes. Consequently, the signal diminishes significantly with deeper penetration. However, EHA enables a 6.2 times increase in signal intensity, with both images background-removed (Graphs D-F). In addition to the significant increase in the peak signal, the EHA image reveals additional details in the line-plot cross-sections that were not readily discernible in the raw signal collection.

To demonstrate the fast imaging capabilities of the EHA system, without sacrificing the SNR, a dynamic sample, mouse spermatozoa, was used. Mouse spermatozoa are small, elongated cells measuring approximately 30 to 40 micrometers long, and on average they travel at a velocity of 146.9 μm/s. They have an oval head with a compact nucleus containing the sperm's DNA. Spermatozoa have a long whip-like tail known as the flagellum, which enables the sperm to exhibit motility and swim through the female reproductive tract for fertilization.

Spermatogenesis, the process of sperm production, occurs within the testes. After their formation, the spermatozoa are released into the rete testis, efferent ductules, and then the epididymides, where they undergo maturation and storage until ejaculation. Within the cauda epididymides, the spermatozoa exhibit movement, although at a slower rate compared to after ejaculation.

Figure 8:
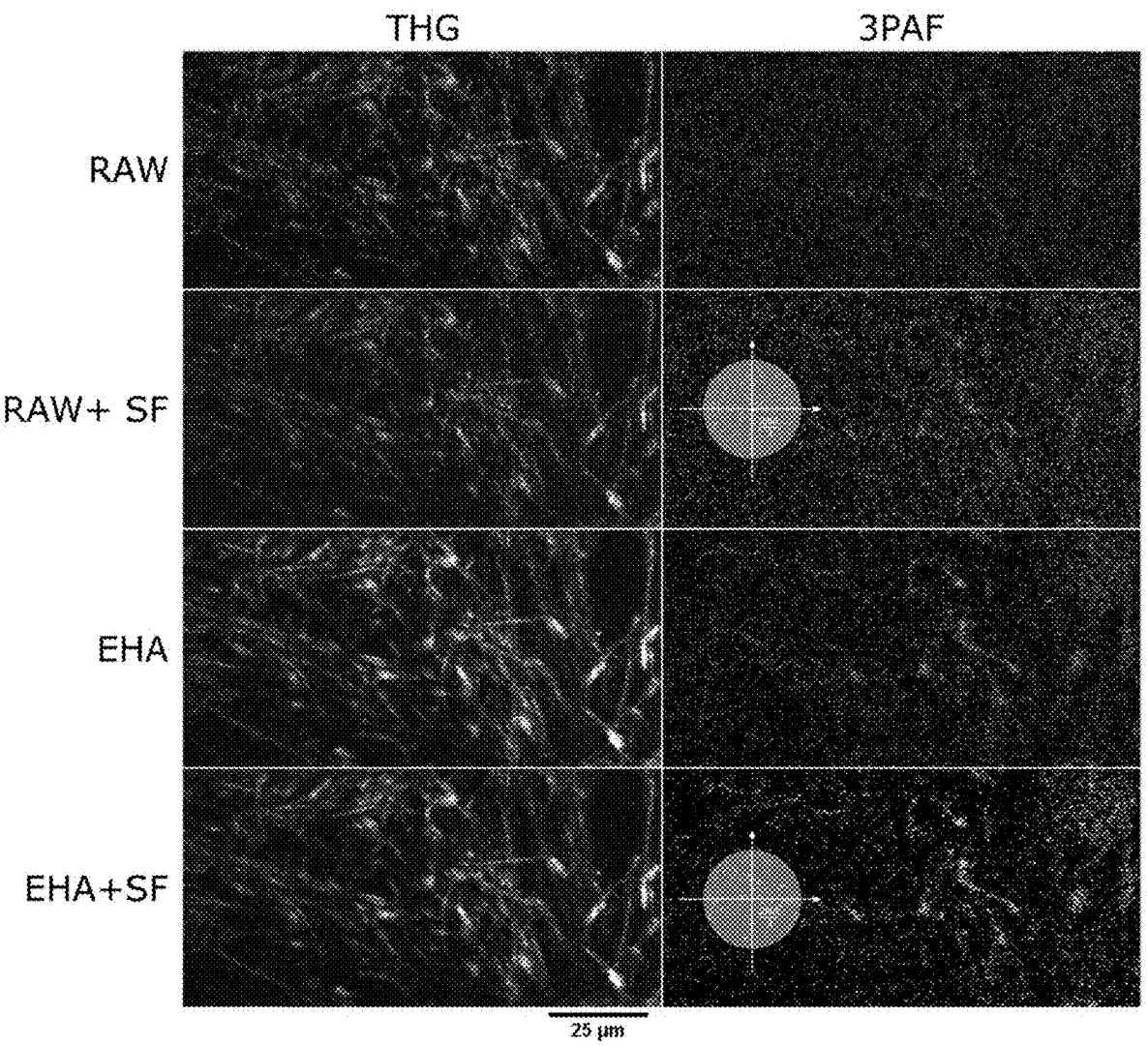
FIG. 8 illustrates example imaging results in accordance with various aspects of the present disclosure.

The cauda epididymis was accessed by making a ventral incision to expose the inner region, and images of the spermatozoa were captured within the cauda epididymis. The imaging results revealed both freely swimming spermatozoa and a group of immature sperms, providing insights into their structure and behavior within this specific microenvironment. These images are shown in FIG. 8. Given the motility rate of the spermatozoa, the high-speed of imaging provided by the EHA system helps capture all of its dynamic activities.

In this experiment, numerical denoising of the images using a Fourier filter was conducted, aiming to compare the physical (EHA) and numerical methods in conjunction. The denoising process involved transforming the images into the spatial frequency domain and applying a filter that selectively allows frequency components within the system's capabilities to pass through. The frequency cutoff ($f_c$) was determined based on the Numerical Aperture (NA) of the objective lens and the wavelength of the excitation light, $f_c = 2NA/\lambda$ (as depicted in the insets of FIG. 8). By employing this filtering method, noise was effectively eliminated by blocking signals originating from outside the spatial bandwidth of the microscope. These signals are typically generated through random processes and do not stem from the voxel of interest.

The THG images clearly demonstrate improvement, exhibiting enhanced sensitivity and higher contrast. Notably, the enhancement in the 3PAF images is even more remarkable. The EHA system successfully recovers signals from the background, enabling the generation of analyzable images that would otherwise be challenging to obtain. Additionally, spatial filtering (SF) of the images exhibits significant improvement. In fact, the images obtained through the combined utilization of EHA and SF showcase the highest contrast among all the experimental conditions.

Figure 9:
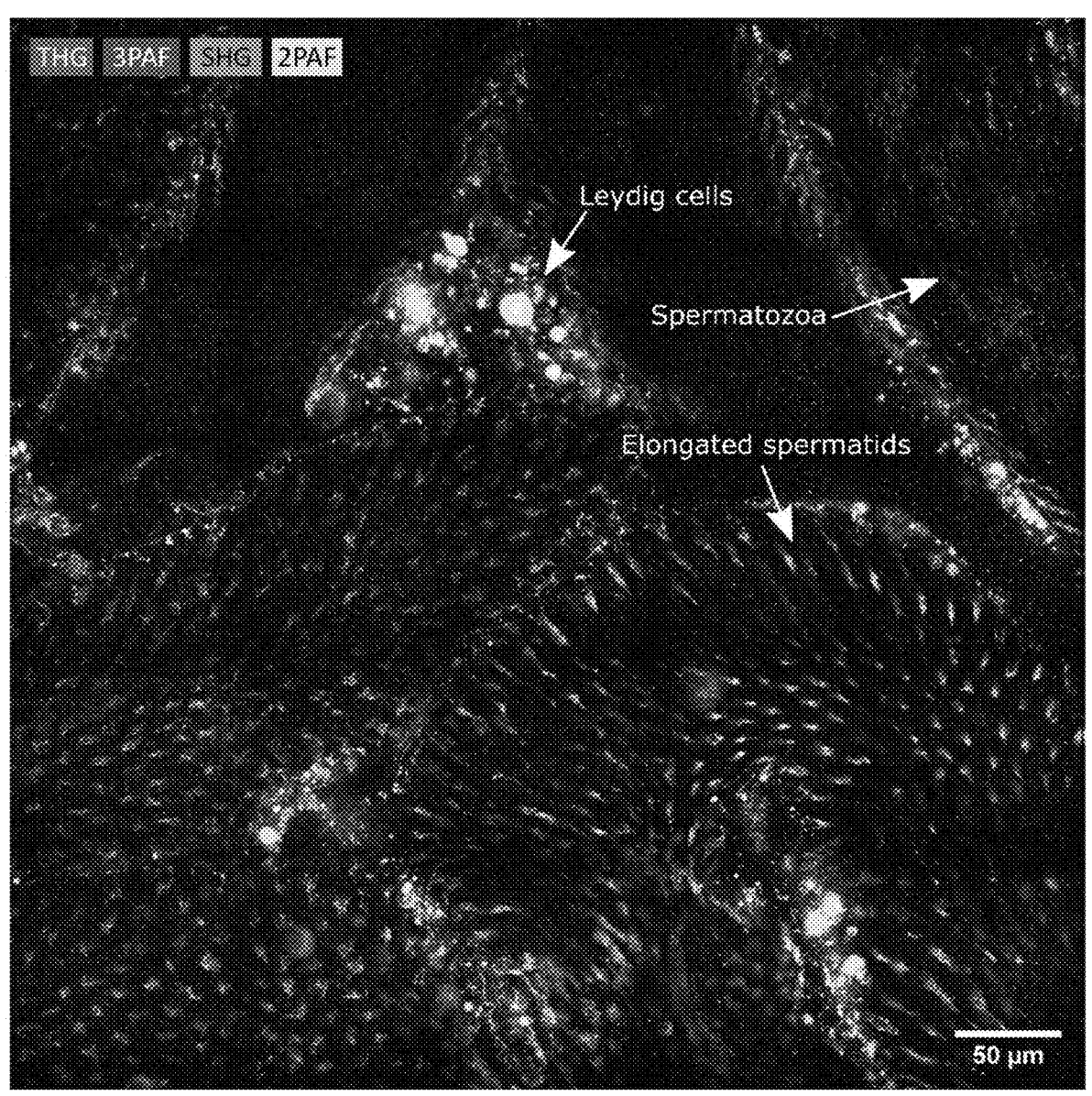
FIG. 9 illustrates example imaging results in accordance with various aspects of the present disclosure.
Figure 10:
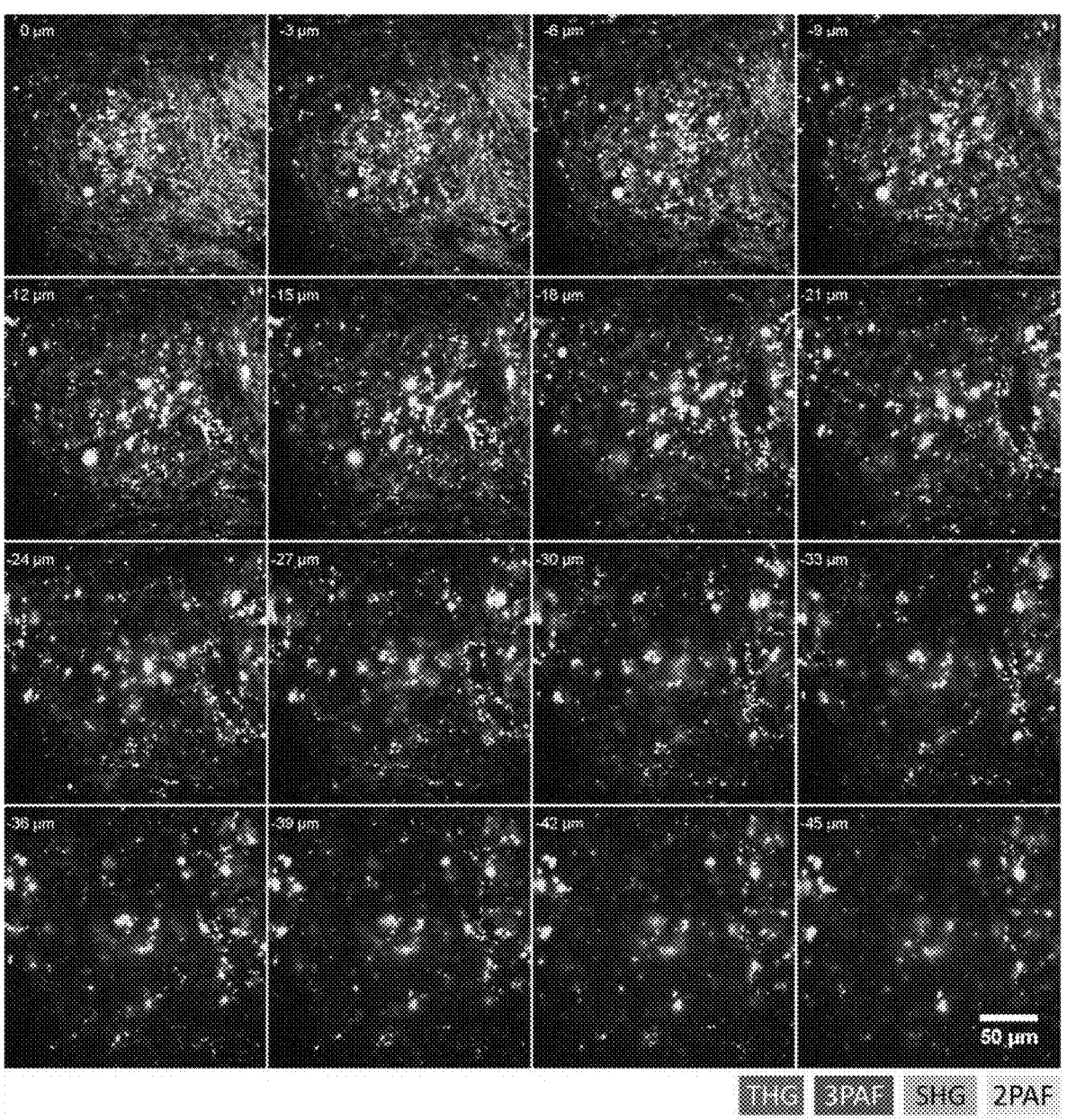
FIG. 10 illustrates example imaging results in accordance with various aspects of the present disclosure.

The high-speed capability of EHA-SLAM also offers advantages in large FOV imaging and Z-stacking. Instead of averaging multiple frames within a single FOV, the system of the present disclosure can rapidly acquire a grid of images. This feature was utilized for ex vivo imaging of a mouse testis (see FIG. 9) and an in situ mouse ovary, including a structure that looks to be a follicle (see FIG. 10), allowing for visualization and multidimensional analysis of the samples. FIG. 9 shows a 5×5 matrix of mouse testes images acquired using the EHA system. The EHA system enables faster mosaicking over larger fields-of-view. The entire gride was taken within 30 seconds, including the physical sample movement time. No averaging was applied to the images. FIG. 10 shows a Z-stack of a mouse ovary imaged using the EHA system. The THG signal shows the outer membrane of the follicle. The SHG signal shows the collagenous tehcal layer of the ovary surrounding the follicle. The combination of 3PAF and 2PAF signals express the metabolism of the cells. All of these frames were taken without averaging.

Figure 11:
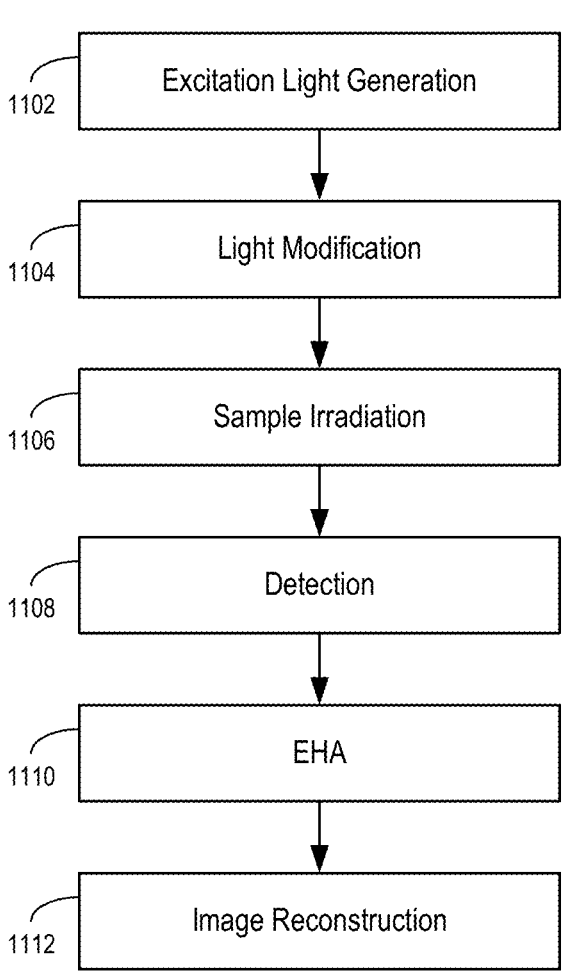
FIG. 11 illustrates an example microscopy method in accordance with various aspects of the present disclosure.

The systems and devices described above may be configured to implement a method of microscopy. One example of such a method 1100 is illustrated in FIG. 11. For purposes of illustration and explanation, the method 1100 will be described as being performed through the system illustrated in FIGS. 1, 3, and 4 although the method 1100 of FIG. 11 may be implemented by a system that is not identical to the system described above with regard to FIGS. 1, 3, and 4.

Method 1100 includes an excitation light generation operation 1102. Operation 1102 may include generating, by a laser light source (e.g., the femtosecond laser light source 102 of FIG. 1), an excitation light. Method 1100 further includes a light modification operation 1104. Operation 1104 may include modulating the excitation light (e.g., by the amplitude/polarization modulator 104), compressing pulses of the excitation light (e.g., by the pulse compressor 108), scanning the excitation light (e.g., via the beam scanner 110), relaying and/or focusing the excitation light (e.g., by the beam relay and focusing element 112), or combinations thereof. Operation 1104 may further include shaping the excitation light (e.g., by the beam shaper 106). Thus, operation 1104 generates imaging light that is based on the excitation light.

Method 1100 further includes a sample irradiation operation 1106. Operation 1106 may include irradiating a sample (e.g., the sample 114) with the imaging light. Method 1100 further includes a detection operation 1108. Operation 1108 may include detecting a light signal from the sample, the light signal being responsive to irradiation of the sample with the imaging light. Operation 1108 may include splitting the light signal into a plurality of channels, each channel corresponding to a different wavelength or wavelength range. Operation 1108 may, in such implementations, include detecting and amplifying multiple ones of the plurality of channels (e.g., by the multi-channel emission detection and amplification element 116).

Method 1100 further includes an EHA operation 1110. Operation 1110 may include performing an electronic heterodyne amplification of the detection signal (e.g., on one or more detected channels), thereby to generate a digital image signal. Operation 1110 may be performed by a lock-in amplifier (e.g., by the multi-channel lock-in amplifier 118). Operation 1110 may 1110 may include locking the detection signal (e.g., by the mixer 410) to a signal having a known frequency (e.g., a laser clock of the femtosecond laser 102, or a signal based thereon), filtering a portion of the locked signal outside of a frequency of interest (e.g., by the filter 412), rectifying the filtered signal to demodulate an envelope thereof (e.g., by the rectifier 414), amplifying the filtered/rectified signal (e.g., by amplifier 416), applying a voltage offset (e.g., by the adder 418), and combinations thereof. If the detection signal or a channel thereof is in the analog format, operation 1110 may include digitizing the analog signal (e.g., by the digitizer 120). Method 1100 may in some implementations, include an image reconstruction operation 1112. Operation 1112 may include reconstructing an image of the sample based on the digital image signal (e.g., by the control unit 122).

The present disclosure presents a solution to address the challenge of low SNR in label-free nonlinear microscopy. By implementing the EHA method specifically on third harmonic generation and 3-photon autofluorescence signals, which are known to be inherently weak due to low signal generation efficiencies secondary to their lower absorption cross sections, SNR limitations were effectively mitigated. The EHA method selectively amplifies the signals at the reference frequency while effectively suppressing background/noise at all other temporal frequencies within the system. This strategic amplification technique allows one to transcend the limitations imposed by the 1/f noise, commonly encountered in the system, and operate in a quasi-noise-free region of the spectrum.

The sources of noise in the system encompass a multitude of factors, including the laser, detectors, and electronics. The noise they introduce predominantly manifests as low-frequency fluctuations, often exhibiting distinctive peaks at various instances. By employing the EHA method, these noise sources and their associated spectral regions are circumvented, enabling substantially improved SNR imaging.

The multi-channel heterodyne amplification method of the present disclosure enhances the SNR by a factor of 2.3, reducing the number of images required to achieve the same quality (SNR) image by five-fold. Thorough characterization was performed for each channel, and this method was successfully applied to achieve high-speed imaging of in vivo mouse cranial bone, bone marrow cavity, spermatozoa, and other cellular dynamics at a frame rate of 3.4 Hz.

By combining this electronic heterodyne amplification method with SLAM microscopy, more rapid label-free imaging with enhanced SNR and improved image quality is enabled. This approach may be used for improving the detection of other weak optical signals that are synchronized to the incident laser pulses and the pulse generation, as well as for various applications in biological and biomedical research, providing insights into the dynamics and structures of complex biological systems.

The present disclosure has described one or more preferred embodiments. However, the invention has been presented by way of illustration and is not intended to be limited to the disclosed embodiments. It should be appreciated that many equivalents, alternatives, variations, and modifications, aside from those expressly stated, are possible and within the scope of the invention.

What is claimed is:

1. A microscopy system comprising:

a laser light source configured to produce an excitation light;

a pulse compressor configured to compress a pulse of the excitation light to produce a pre-compensated light;

a beam scanner configured to raster scan the pre-compensated light on a sample;

a multi-channel detector configured to receive a light signal from the sample and produce a multi-channel detection signal; and a multi-channel lock-in amplifier configured to receive the multi-channel detection signal and perform a multi-channel electronic heterodyne amplification of the multi-channel detection signal, wherein the multi-channel lock-in amplifier includes:

an internal oscillator, a phase lock loop (PLL) configured to lock the internal oscillator to an input clock frequency thereby to generate a reference signal, a mixer configured to multiply the multi-channel detection signal by the reference signal, thereby to generate a multiplied signal, a filter configured to filter the multiplied signal, thereby to generate a filtered signal, a rectifier configured to demodulate an envelope of the filtered signal, thereby to generate a rectified signal, and an amplifier configured to apply a gain to the rectified signal, thereby to generate an amplified signal.

2. The system of claim 1, further comprising a modulator configured to modulate the excitation light, wherein the modulator is an amplitude modulator or a polarization modulator.

3. The system of claim 1, further comprising a beam shaper configured to modify a spatial profile of the modulated light.

4. The system of claim 1, wherein the multi-channel detector further includes an amplifier.

5. The system of claim 1, wherein the multi-channel lock-in amplifier is further configured to receive a laser clock from the laser light source.

6. The system of claim 1, wherein the multi-channel detector is configured to receive a plurality of single channels individually and produce the multi-channel detection signal.

7. The system of claim 1, further comprising a control unit configured to control the modulator and the beam scanner.

8. The system of claim 7, wherein the control unit is configured to receive an output of the multi-channel lock-in amplifier in a digital format, and to perform an image reconstruction of the sample based on the output.

9. The system of claim 1, wherein the multi-channel lock-in amplifier includes a phase shifter configured to apply a phase change on the locked signal, thereby to generate the reference signal.

10. The system of claim 1, wherein the input clock frequency corresponds to a clock of the laser light source.

11. The system of claim 1, wherein the multi-channel lock-in amplifier includes an adder configured to apply an offset voltage to the amplified signal, thereby to generate an output signal.

12. A multi-channel lock-in amplifier configured to perform multi-channel electronic heterodyne amplification, the multi-channel lock-in amplifier comprising:

a first-channel input configured to receive a first channel of a detection signal, the first channel of the detection signal corresponding to an imaging of a sample that has been irradiated with an excitation light from a laser light source;

an input reference configured to receive a first reference signal having a known frequency;

an internal oscillator;

a phase lock loop (PLL) configured to lock the internal oscillator to the input reference, thereby to generate a second reference signal;

a mixer configured to multiply the first channel of the detection signal by the second reference signal, thereby to generate a multiplied signal;

a filter configured to filter the multiplied signal, thereby to generate a filtered signal;

a rectifier configured to demodulate an envelope of the filtered signal, thereby to generate a rectified signal; and a gain amplifier configured to apply a gain to the rectified signal, thereby to generate an amplified signal.

13. The amplifier of claim 12, further comprising a phase shifter between the PLL and the mixer, and configured to apply a phase change to the second reference signal.

14. The amplifier of claim 12, further comprising an adder configured to add a voltage offset to the amplified signal, thereby to generate an output signal.

15. The amplifier of claim 12, wherein the reference signal is a clock of the laser light source.

16. The amplifier of claim 12, further comprising:

a second-channel input configured to receive a second channel of the detection signal, the second channel of the detection signal corresponding to the imaging of the sample that has been irradiated with the excitation light, wherein a wavelength range of the second channel of the detection signal is different from a wavelength range of the first channel of the detection signal.

17. A microscopy method, comprising:

generating, by a laser light source, an excitation light;

irradiating a sample with an imaging light, wherein the imaging light is based on the excitation light;

detecting a light signal from the sample, thereby to generate a multi-channel detection signal, wherein the light signal is responsive to irradiation of the sample with the imaging light; and performing a multi-channel electronic heterodyne amplification of the multi-channel detection signal, thereby to generate a digital image signal, wherein the multi-channel electronic heterodyne amplification includes:

multiplying the multi-channel detection signal by a reference signal having a known frequency to generate a multiplied signal, the reference signal being based on an output from an internal oscillator, filtering the multiplied signal to generate a filtered signal, demodulating an envelope of the filtered signal to generate a rectified signal, and amplifying to the rectified signal to generate an amplified signal, the digital image signal being based on the amplified signal.

18. The method of claim 17, further comprising reconstructing an image of the sample based on the digital image signal.

19. The method of claim 17, wherein the multi-channel electronic heterodyne amplification includes:

locking an internal oscillator to a clock of the laser light source to generate the reference signal.

20. The method of claim 14, wherein the multi-channel electronic heterodyne amplification further includes applying a voltage offset to the amplified signal to generate the digital image signal.

21. The method of claim 17, wherein an order of a multiphoton process of the microscopy method is resolved by locking the multi-channel detection signal to at least one frequency based on the order.

22. The method of claim 17, wherein coherent and incoherent signals are resolved from each other by modulating a polarization of the excitation light, and lock ed to at least one modulated frequency.

\* \* \* \* \*